(12) United States Patent
Shishido et al.

(10) Patent No.: US 9,521,771 B2
(45) Date of Patent: Dec. 13, 2016

(54) DEVICE CASE AND METHOD OF MANUFACTURING THE SAME

(71) Applicant: GS Yuasa International, Ltd., Kyoto-shi (JP)

(72) Inventors: Hidenori Shishido, Kyoto (JP); Makoto Murakami, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 332 days.

(21) Appl. No.: 13/864,116

(22) Filed: Apr. 16, 2013

(65) Prior Publication Data

US 2013/0270981 A1 Oct. 17, 2013

(30) Foreign Application Priority Data

Apr. 17, 2012 (JP) .................................. 2012-093466
Apr. 4, 2013 (JP) .................................. 2013-078396

(51) Int. Cl.
| | |
|---|---|
| *H05K 5/03* | (2006.01) |
| *H05K 13/00* | (2006.01) |
| *H01M 2/04* | (2006.01) |
| *B23K 15/00* | (2006.01) |
| *B23K 26/26* | (2014.01) |
| *B23K 26/32* | (2014.01) |

(52) U.S. Cl.
CPC ............... *H05K 5/03* (2013.01); *B23K 15/006* (2013.01); *B23K 26/244* (2015.10); *B23K 26/26* (2013.01); *B23K 26/32* (2013.01); *H01M 2/0426* (2013.01); *H05K 13/00* (2013.01); *B23K 2201/12* (2013.01); *B23K 2201/18* (2013.01); *B23K 2201/36* (2013.01); *B23K 2203/08* (2013.01); *B23K 2203/10* (2013.01); *Y10T 29/49908* (2015.01)

(58) Field of Classification Search
CPC ............................... H01M 2/0426; H05K 5/03
USPC ..................................... 29/505, 632.2, 632.1
See application file for complete search history.

(56) References Cited

U.S. PATENT DOCUMENTS

| | | | |
|---|---|---|---|
| 7,655,353 | B2 | 2/2010 | Kwon |
| 8,178,235 | B2 | 5/2012 | Cheon et al. |
| 2006/0178708 | A1 | 8/2006 | Rorvick et al. |
| 2007/0128514 | A1 | 6/2007 | Yoshida |
| 2010/0143792 | A1 | 6/2010 | Kim |

(Continued)

FOREIGN PATENT DOCUMENTS

| | | |
|---|---|---|
| DE | 10 2011 077 689 A1 | 12/2012 |
| JP | 09-007557 A | 1/1997 |

(Continued)

OTHER PUBLICATIONS

Machine translation of JP 2001-155698, obtained Apr. 7, 2016.*

(Continued)

*Primary Examiner* — Nicholas P D'Aniello
(74) *Attorney, Agent, or Firm* — McGinn IP Law Group, PLLC

(57) ABSTRACT

A device case includes: a case body having a side wall and an opening; a lid plate for closing the opening, an end portion of the lid plate being projected from an outer surface of the side wall; and a welded portion that joins the lid plate with the side wall. The lid plate has a beam receiving area located in a vicinity of an end portion of the lid plate for receiving a beam emitted vertically with respect to the beam receiving area.

17 Claims, 4 Drawing Sheets

(56) References Cited

U.S. PATENT DOCUMENTS

| | | |
|---|---|---|
| 2010/0258538 A1 | 10/2010 | Suzuki et al. |
| 2011/0076555 A1 | 3/2011 | Jeong |
| 2011/0240613 A1 | 10/2011 | Hosokawa et al. |
| 2012/0079713 A1 | 4/2012 | Hosokawa et al. |
| 2012/0282519 A1 | 11/2012 | Freitag |
| 2012/0308855 A1 | 12/2012 | Shimizu et al. |

FOREIGN PATENT DOCUMENTS

| | | |
|---|---|---|
| JP | 09-259841 A | 10/1997 |
| JP | 2001-155698 A | 6/2001 |
| JP | 3233841 B | 12/2001 |
| JP | 2003-132857 A | 5/2003 |
| JP | 2004-195490 A | 7/2004 |
| JP | 2006-019089 A | 1/2006 |
| JP | 2006-310313 A | 11/2006 |
| JP | 2007-134156 A | 5/2007 |
| JP | 2009-146645 A | 7/2009 |
| JP | 4454928 B | 4/2010 |
| JP | 4499683 B2 | 7/2010 |
| JP | 2011-129266 A | 6/2011 |
| JP | 2011-171078 A | 9/2011 |
| JP | 2011-181215 A | 9/2011 |
| JP | 2011-212711 A | 10/2011 |
| JP | 2012-079476 A | 4/2012 |

OTHER PUBLICATIONS

European Search Report dated Sep. 5, 2013.
Gorscak, Sharon, et al. GSI Lumonics.Reprinted from Hybrid Circuit Technology, Aug. 1991, Copyright 1991, Lake Publishing/An IHS Group Company, Libertyville, Illinois U.S.A. "Design Guideline #1, Designer's Guide for Laser Hermetic Sealing" url: http://www.designsci.com/Design_Guidline 1.pdf [downloaded on Sep. 30, 2014].
European Office Action dated Jun. 10, 2015.

* cited by examiner

DEVICE CASE AND METHOD OF MANUFACTURING THE SAME

CROSS-REFERENCE TO RELATED APPLICATIONS

This application claims priority from Japanese Patent Applications No. 2012-093466 filed on Apr. 17, 2012, and No. 2013-078396 filed on Apr. 4, 2013, the entire contents of which are hereby incorporated by reference.

FIELD

The present invention relates to a device case and a method of manufacturing the same.

BACKGROUND

In a method of manufacturing a device case, plate members are welded to each other in some cases. More specifically, such a method includes bringing a second plate member as part of the device case into contact with an end of a first plate member as another part of the device case so as to be substantially perpendicular to the first plate member, and applying a welding focused beam to weld and fix the first plate member and the second plate member such that a welded portion is formed at a contact portion between the first plate member and the second plate member. In other words, the method of manufacturing the device case employs the welding technique of applying a focused beam to a portion to be welded so as to precisely control the position of the welded portion between the plate members.

More specifically, there has been known a method disclosed in JP-A-2004-195490 as one of the methods of manufacturing a device case with use of this welding technique. This method employs the so-called penetration welding technique. In this technique, an end of an upper wall (top plate) is mounted on an upper end of an upright wall, the contact portion therebetween is irradiated with a focused beam (laser beam) from above the top plate to generate a welded portion entirely across the width in the thickness direction of the top plate. The welded portion reaches an upper portion of the upright wall.

This penetration welding technique is advantageous in that the focused beam is not incident into the device case and the irradiated position does not have to be set so accurately, in comparison to a case of directly applying a focused beam to the contact portion between the upright wall and the top plate.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

A device case according to an aspect of the present invention includes: a case body comprising a side wall and an opening; a lid plate for closing the opening, an end portion of the lid plate being projected from an outer surface of the side wall; and a welded portion that joins the lid plate with the side wall. The lid plate comprises a beam receiving area located in a vicinity of an end portion of the lid plate for receiving a beam emitted vertically with respect to the beam receiving area.

According to another aspect of the present invention, there is provided a method of manufacturing a device case including a first plate member and a second plate member, the method including the steps of: bringing the second plate member into contact with an end of the first plate member; and applying a beam to a contact portion between the first plate member and the second plate member to form a welded portion. An end portion of the second plate member is projected from an outer surface of the first plate member in the contacting step, the beam is applied to an outer surface of the second plate member opposite to a surface in contact with the first plate member in the applying step, and the welded portion extends over the end portion of the second plate member and does not reach an inner surface of the first plate member.

BRIEF DESCRIPTION OF THE DRAWINGS

The foregoing and other features of the invention will become apparent to one skilled in the art to which the present invention relates upon consideration of the invention with reference to the accompanying drawings, wherein.

DESCRIPTION OF EMBODIMENTS

Figure 1:
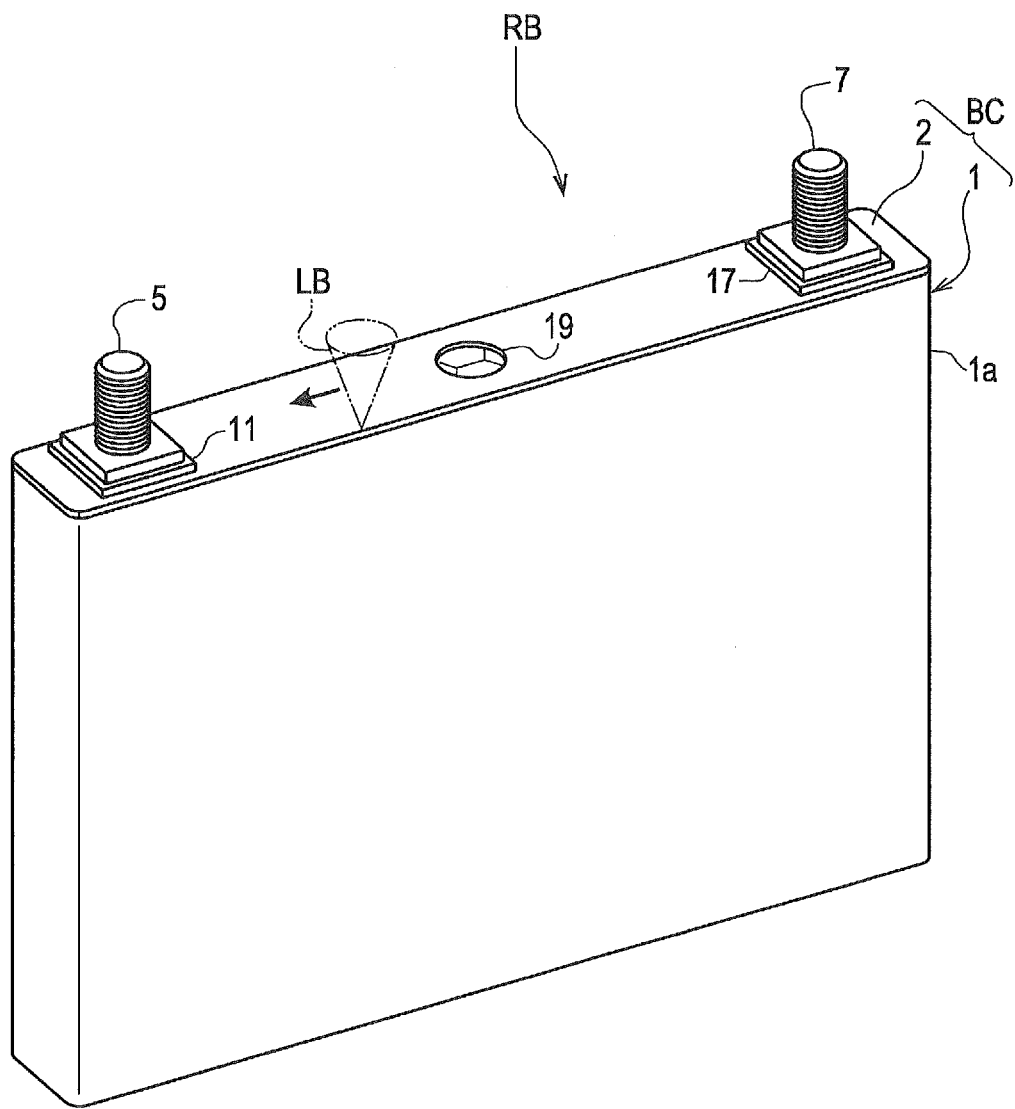
FIG. 1 is a perspective view showing outer appearance of a secondary battery according to an embodiment of the present invention.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the conventional welding technique, because a welding focused beam is applied to a position close to an inner side of the device case, and the upright wall is thin, there are the following disadvantages. More specifically, the welded portion by the focused beam reaches the inner surface of the device case on the upright wall, and molten matter spatters into the device case through a slight gap between the upright wall and the top plate and the like.

Such molten matter spattered into the device case can adversely affect operations of a member located in the device case.

It is an object of the present invention to prevent as much as possible spatter of the molten matter into the device case even with use of the penetration welding technique.

Preferred embodiments of the present invention will be described hereinafter. Described with reference to the drawings is an example of a method of manufacturing a device case according to an embodiment of the present invention.

This example applies the present method to the step of manufacturing a battery exemplifying an electrical storage device.

The present embodiment exemplifies a nonaqueous electrolyte secondary battery (more particularly a lithium ion battery) as an example of a secondary battery. In the following description, the expression "inner side" refers to an inner surface of a case or a direction toward the inside of the case. On the other hand, the expression "outer side" refers to an outer surface of the case or a direction toward the outside of the case. An "inner surface" of a lid plate faces an opened surface of a case body, while an "outer surface" or an "upper surface" of the lid plate is located opposite to the opened surface of the case body.

Configuration of Secondary Battery

As shown in the perspective view of FIG. 1, a nonaqueous electrolyte secondary battery RB according to the present embodiment includes a device case BC (hereinafter, simply referred to as the case BC). This case BC includes a case body 1 having a side wall and an opening, and a lid plate 2 covering the opening of the case body 1. The case body 1 has a bottomed cylindrical shape, and more particularly, a bottomed rectangular pipe shape (a substantially rectangular parallelepiped shape). The lid plate 2 is a plate member in a belt shape, and has an outer surface as part of the outer sides of the case BC and an inner surface as part of the inner sides of the case BC. The lid plate 2 is provided, on its outer surface, with a positive electrode terminal (terminal bolt) 5 and a negative electrode terminal (terminal bolt) 7.

Figure 3:
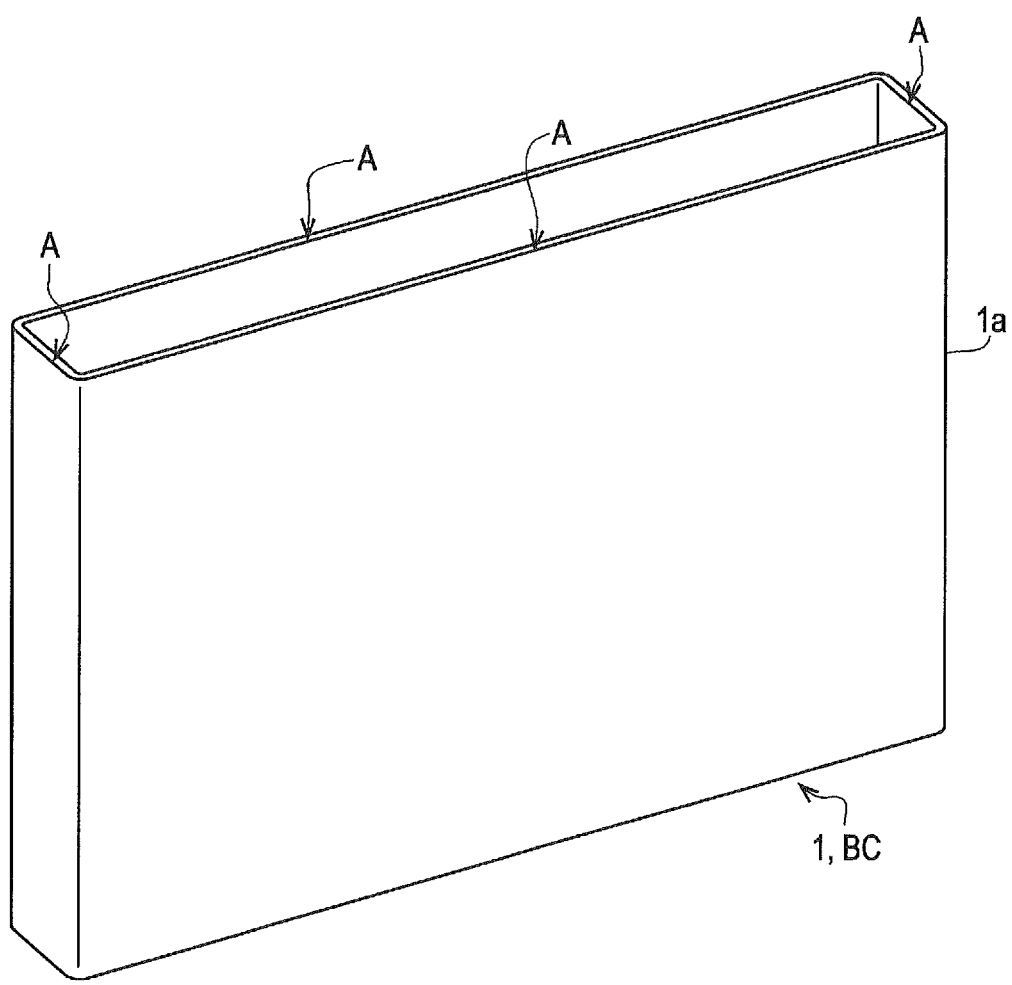
FIG. 3 is a perspective view of a case body as part of a device case according to the embodiment of the present invention.

As shown in FIG. 3, the case body 1 has the opening in a belt shape corresponding to the shape of the lid plate 2.

The case body 1 and the lid plate 2 thus configured form the case BC that has a substantially flat rectangular parallelepiped shape.

In the following description, the case BC according to the present embodiment is expressed to have a first plate member and a second plate member. The first plate member corresponds to a wall plate 1a that has a cylindrical shape and configures the side wall of the case body 1, while the second plate member corresponds to the lid plate 2. The present invention is thus applied to the step of welding the first and second plate members.

Figure 2:
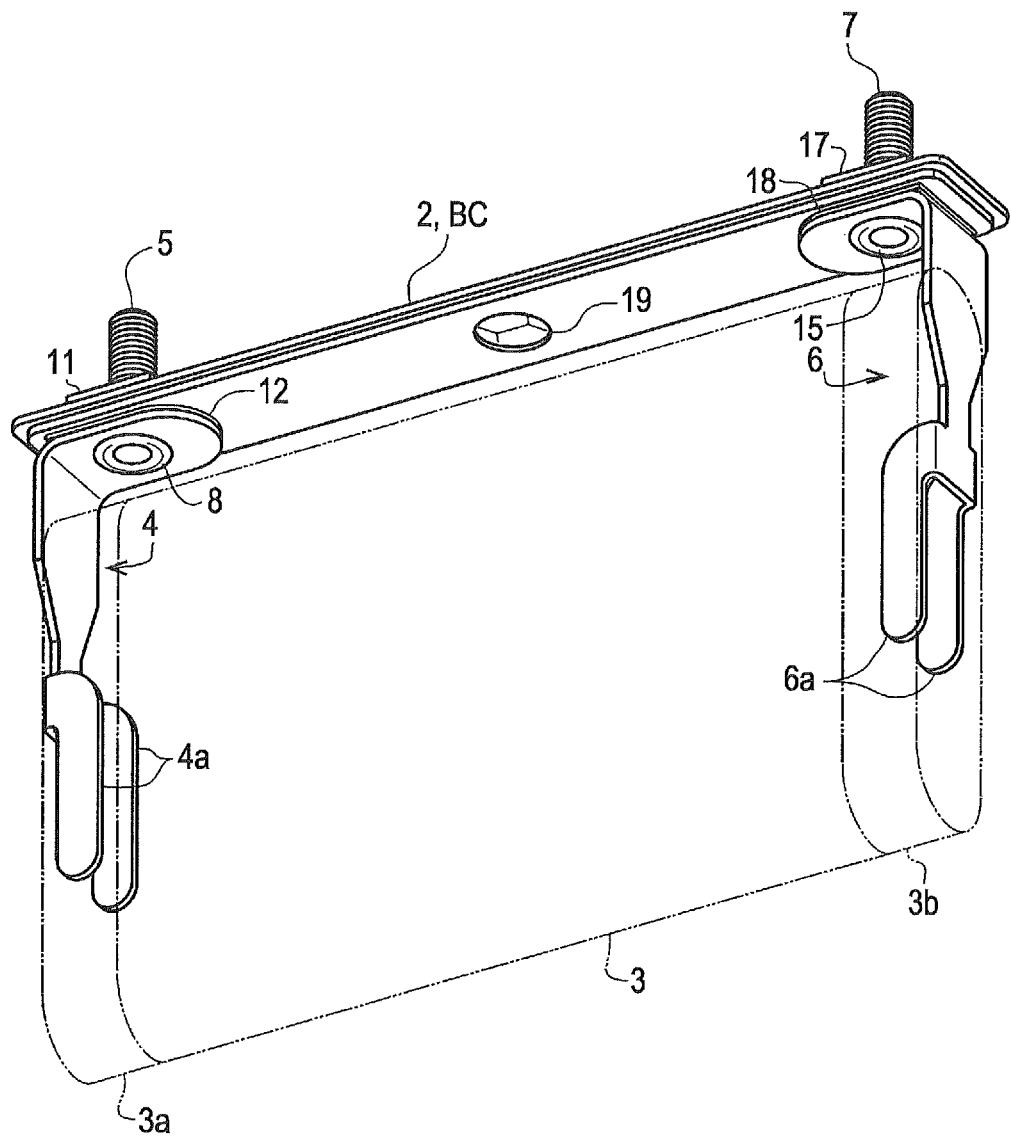
FIG. 2 is a perspective view showing an internal structure of the secondary battery according to the embodiment of the present invention.

Described with reference to FIG. 2 is the internal structure of the case BC. FIG. 2 is a perspective view, seen from downward, of the internal structure of the case BC excluding the case body 1. As shown in this figure, the case BC is provided therein with a power generating element 3 indicated by a two-dot chain line, as well as current collectors 4 and 6. These components are accommodated and located at predetermined positions in the case and are partly immersed in electrolyte solution.

The current collector 4 is a conductive plate member and electrically connects the power generating element 3 and the terminal bolt 5. The current collector 6 is a conductive plate member and electrically connects the power generating element 3 and the terminal bolt 7.

As shown in FIG. 2, the current collectors 4 and 6 have substantially the same shapes, and are located symmetrically with each other at the respective ends of the lid plate 2. The current collectors 4 and 6 are, however, made of materials different from each other. The positive electrode current collector 4 is mainly made of aluminum, whereas the negative electrode current collector 6 is mainly made of copper.

These current collectors 4 and 6 are conductive plate members and have substantially inversed L shapes (hereinafter, also referred to as L-shaped plate members). More specifically, the L-shaped plate members each have an upright portion extending along a side surface in the width direction of the case body 1, and a bottom portion extending perpendicularly from an end of the upright portion and along the lid plate 2. The upright portion is provided with, at the respective ends in the longitudinal direction, a pair of connective portions that nip the power generating element 3. More specifically, the current collector 4 has a pair of connective portions 4a, while the current collector 6 has a pair of connective portions 6a.

The power generating element 3 is of the so-called winding type. More specifically, the power generating element includes a pair of electrode plates, namely, a foil-like positive electrode plate and a foil-like negative electrode plate. The foil-like positive electrode plate has a long belt shape. The foil-like negative electrode plate also has a long belt shape. Each of the electrode plates is provided thereon with an active material layer. These electrode plates are laminated with a separator in a long belt shape being interposed therebetween, and are wound. The power generating element 3 can be formed into the flat shape so as to correspond to the shape of the case BC by winding the electrode plates and the like around a flat core member.

The foil-like positive electrode plate and the foil-like negative electrode plate have unapplied portions 3a and 3b, respectively, which are provided with no active material layer. More specifically, the unapplied portions 3a and 3b are narrow belt-like regions that are located at the respective ends in the width direction of the electrode plates and are not provided with any active material layer.

The electrode plates and the like are wound such that the foil-like positive electrode plate and the foil-like negative electrode plate are laminated with the unapplied portions 3a and 3b projecting oppositely in the width direction of the electrode plates and the like. As schematically shown in FIG. 2, the unapplied portions 3a and 3b are located at the respective ends in the winding core member direction.

The unapplied portions 3a and 3b thus located are welded to the connective portions 4a and 6a of the current collectors 4 and 6, respectively.

The lid plate 2 is made of metal (more particularly, metal mainly including aluminum). As mentioned earlier, the positive electrode terminal bolt 5 and the negative electrode terminal bolt 7 are attached to the lid plate 2. The terminal bolt 5 is electrically connected to the positive electrode current collector 4. On the other hand, the negative electrode terminal bolt 7 is electrically connected to the negative electrode current collector 6.

The terminal bolt 5 has a head integrally provided with a rivet 8. More specifically, there is interposed, between the terminal bolt 5 and the lid plate 2, an upper gasket 11 for electrical insulation and airtightness. Subsequently, there is interposed, between the lid plate 2 and the current collector 4, a lower gasket 12 for electrical insulation and airtightness. The upper and lower gaskets are then fixed by the rivet 8 (see FIG. 2). At the same time, the rivet 8 is caulked to electrically connect the terminal bolt 5 with the current collector 4.

The negative electrode portion is configured similarly to the positive electrode portion. More specifically, the terminal bolt 7 has a head integrally provided with a rivet 15. Furthermore, there is interposed, between the terminal bolt 7 and the lid plate 2, an upper gasket 17 for electrical insulation and airtightness. On the other hand, there is interposed, between the lid plate 2 and the current collector 6, a lower gasket 18 for electrical insulation and airtightness.

The upper and lower gaskets are fixed by the rivet 15. The rivet 15 is caulked to electrically connect the terminal bolt 7 with the current collector 6.

Steps of Manufacturing Secondary Battery

Described next is the steps of manufacturing the secondary battery RB. Mainly described with reference to the drawings is assembling (production) of the device case BC according to an embodiment of the present invention.

As described earlier, the case BC includes the case body 1 and the lid plate 2. This lid plate 2 is a plate member that is made of metal (such as metal mainly including aluminum) and provided therein with a plurality of through holes. These through holes include through holes for allowing the terminal bolts 5 and 7 to penetrate therethrough, and a through hole for locating a safety valve 19. The lid plate 2 is provided, at the edge thereof, with a stepped portion. The lid plate 2 is engaged with the case body 1 at the stepped portion.

The case body 1 is made of the material same as that of the lid plate 2. More specifically, the case body 1 is a bottomed rectangular pipe member in a flat shape, and is obtained by the so-called deep drawing a plate member made of metal (more particularly, metal mainly including aluminum).

The safety valve 19 is attached into the certain through hole in the lid plate 2. Meanwhile, the rivets 8 and 15 of the terminal bolts 5 and 7 are inserted from outside the case BC into the through holes for the terminal bolts 5 and 7 in the lid plate 2, respectively. As shown in FIG. 2, respectively at the positive electrode portion and the negative electrode portion, as mentioned above, the terminal bolts 5 and 7 (the rivets 8 and 15) penetrate the upper gaskets 11 and 17 such that the upper gaskets 11 and 17 are located outside the lid plate 2. On the other hand, the terminal bolts 5 and 7 (the rivets 8 and 15) are inserted into the lower gaskets 12 and 18 and the upper ends of the current collectors 4 and 6 such that the lower gaskets 12 and 18 and the upper ends of the current collectors 4 and 6 are located inside the lid plate 2. The rivets 8 and 15 are then caulked. As a result, the lid plate 2 is nipped between the upper gaskets 11 and 17 and the lower gaskets 12 and 18, respectively.

The power generating element 3 flatly wound as described earlier is welded to the current collectors 4 and 6 that are thus attached to the lid plate 2. More specifically, the unapplied portion 3a of the power generating element 3 is retained by the pair of connective portions 4a of the current collector 4. Meanwhile, the unapplied portion 3b of the power generating element 3 is retained by the pair of connective portions 6a of the current collector 6. These retained portions are then welded by ultrasonic welding or the like.

The components (the current collectors 4 and 6) thus attached to the lid plate 2 are inserted into the case body 1. The edge (indicated by arrows A in FIG. 3) of the opened surface of the case body 1 is located so as to abut against the lower portion (closer to the edge) of the stepped portion of the lid plate 2. In the state where the lid plate 2 and the case body 1 are assembled together, the lid plate 2 is in contact with the upper end (the edge of the opened surface) of the wall plate 1a as the side surface of the case body 1 so as to be substantially perpendicular thereto.

After having been assembled together, the lid plate 2 is pressed against the case body 1 and the upper end of the wall plate 1a and the edge of the lid plate 2 are welded and fixed together along the entire periphery of the lid plate 2.

This welding work is performed with use of a laser welding device in the present embodiment. Such a laser welding device is preferably a fiber laser welding device or the like, which realizes a small spot diameter of a laser beam. In the welding work, a laser beam emitted from the laser welding device and focused by an optical system included in the device is referred to as a welding focused beam (hereinafter, referred to as a focused laser beam LB). This focused beam is applied to a portion to be welded (the contact portion between the wall plate 1a of the case body 1 and the lid plate 2). The portion to be welded is thus melted to form a welded portion.

In the actual welding work, the focused laser beam LB schematically indicated by two-dot chain lines in FIG. 1 is applied to the contact portion between the lid plate 2 and the case body 1. The laser beam is applied to the lid plate 2 from the opposite side of the surface of the lid plate 2 in contact with the wall plate 1a of the case body 1. More specifically, the laser beam is applied from outside the case BC to the edge and the vicinity of the lid plate 2 substantially along the normal line of the lid plate 2.

The laser welding device is capable of two-dimensionally scanning the focused laser beam LB along the upper surface (the outer surface of the case BC) of the lid plate 2. The laser welding device is thus capable of scanning the focused laser beam LB along the edge of the lid plate 2 on the entire periphery of the lid plate 2.

Figure 4A:
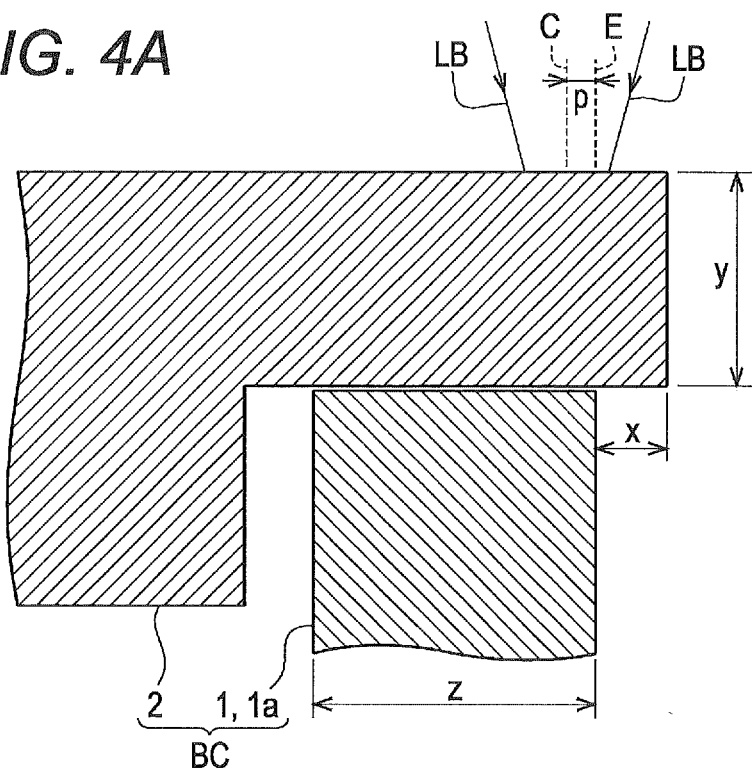
FIGS. 4A and 4B are sectional views of a main portion according to the embodiment of the present invention.
Figure 4B:
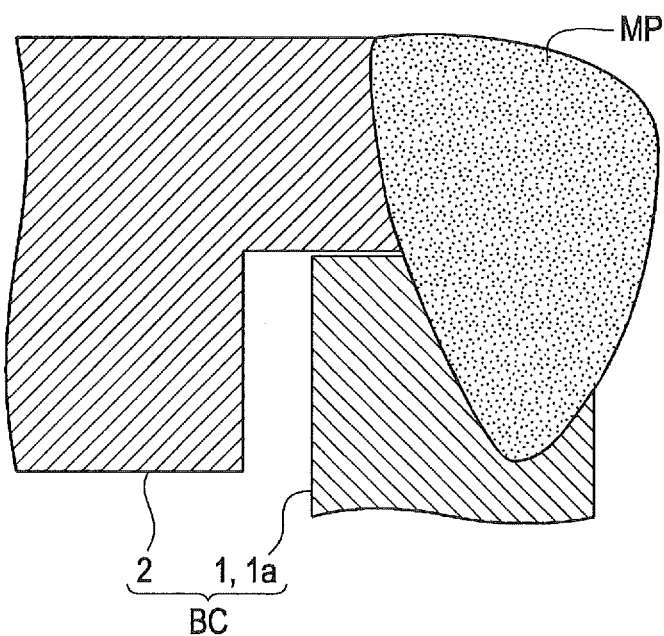

The portion welded by the focused laser beam LB is described with reference to FIGS. 4A and 4B. FIGS. 4A and 4B are enlarged sectional side views of the contact portion between the stepped portion near the edge of the lid plate 2 and the upper end of the wall plate 1a of the case body 1. FIG. 4A shows the state before welding. FIG. 4B shows the state melted by applying the focused laser beam.

Upon the welding work, the lid plate 2 and the case body 1 are positioned to each other as shown in FIG. 4A. More specifically, the lid plate 2 is positioned at the opened surface of the case body 1 such that the tip end at the edge of the lid plate 2 extends from the outer surface of the wall plate 1a of the case body 1 by a set length (a length "x" indicated in FIG. 4A). The length "x" is set in accordance with "the outer surface of the wall plate 1a of the case body 1", more precisely, "the outer surface of the wall plate 1a of the case body 1 at the end in contact with the lid plate 2".

The extending length "x" is set in the range $0 \text{ mm} < x \leq 0.25$ mm, in other words, so as not to exceed 0.25 mm. In such a configuration, there is formed, below the tip end of the lid plate 2, a gap extending along the outer surface of the wall plate 1a.

A thickness "y" of the lid plate 2 at the portion to be welded where the lid plate 2 and the wall plate 1a of the case body 1 are in contact with each other is set in the range $0.4 \text{ mm} \leq y \leq 0.8$ mm. The lid plate 2 is made thick to some extent at the portion to be welded so as to increase the volume of the melt portion on the lid plate 2 to some extent, which leads to stabilized welding. On the other hand, the lid plate 2 is made not excessively thick, so as not to excessively increase the strength of the welding focused laser beam LB.

Furthermore, a thickness "z" of the wall plate 1a at the portion to be welded where the lid plate 2 and the wall plate 1a of the case body 1 are in contact with each other can be set in the range $0.4 \text{ mm} \leq z \leq 1.1$ mm.

In the positioned state as described above, as shown in FIG. 4A, the focused laser beam LB is applied to the portion to be welded (a beam receiving portion).

The optical axis of the focused laser beam LB is set to be along the normal line of the upper surface (the outer surface of the case BC) of the lid plate 2. The center (the position indicated by a broken line C in FIG. 4A) of the optical axis of the focused laser beam LB is displaced by a predetermined distance "p" from the position (the position indicated by a broken line E in FIG. 4A) of the outer surface (the outer surface of the case BC) of the wall plate 1a of the case body 1 toward the inner side of the case BC. More particularly, the distance "p" is set in the range 0 mm≤p≤0.4 mm. The positional relationship by the distance "p" is expressed more precisely such that, along the normal line of the surface of the lid plate 2, the center in the area irradiated with the focused laser beam LB in the surface of the lid plate 2 is displaced by the predetermined distance "p" toward the inner side of the case BC from the outer surface of the case BC at the end of the wall plate 1a of the case body 1 in contact with the lid plate 2.

Furthermore, the focused laser beam LB is set to have a spot diameter (diameter) "d" satisfying d≤0.6 mm on the upper surface of the lid plate 2. The spot diameter "d" can have a lower limit value appropriately set in accordance with welding power or a welded area, and preferably satisfies (x+p)/2≤d. The tip end at the edge of the lid plate 2 can be effectively melted in such a configuration.

By setting, as described above, the center of the optical axis of the focused laser beam LB and the spot diameter on the upper surface of the lid plate 2, the area in the surface of the lid plate 2 irradiated with the focused laser beam LB is extended beyond the position, which is indicated by the broken line E, toward the tip end of the lid plate 2, as shown in FIG. 4A. In other words, the irradiated area is set to extend beyond the outer surface (the wall plate 1a of the case body 1) of the case BC to outside the case BC along the normal line of the outer surface of the case.

Those parameters (the center of the optical axis and the like) are set such that the irradiated area is located in the normal line direction of the wall plate 1a of the case body 1 so as not to reach the tip end of the lid plate 2. The focused laser beam LB is thus prevented from being applied to the case body 1 beyond the lid plate 2.

A welded portion MP is formed by applying the focused laser beam LB to the portion to be welded in the state where the dimension of the case BC at the portion to be welded, the position to apply the focused laser beam LB, and the like are set as described above. The welded portion MP is indicated by a dotted area in FIG. 4B. More specifically, the welded portion MP is formed so as to entirely include the tip end of the lid plate 2 that extends by the length "x" from the outer surface of the case BC (the outer surface of the wall plate 1a of the case body 1) as well as not to reach the inner surface of the case BC (the inner surface of the wall plate 1a of the case body 1). The welded portion MP extends to reach the upper surface of the lid plate 2. The welded portion MP includes only part of the wall plate 1a of the case body 1. This part corresponds to part of the welded portion on the outer side of the case BC.

The welded portion MP is shaped so as to bulge in the normal line direction of the outer surface of the case BC from the outer surface of the case BC (the wall plate 1a of the case body 1). The shape of the welded portion MP is kept even after the welded portion MP is solidified, so that the welded portion MP reinforces a joint portion between the wall plate 1a of the case body 1 and the lid plate 2.

In this manner, the lid plate 2 and the case body 1 are completely welded together on the entire periphery of the edge of the lid plate 2. Subsequently, the case BC is filled with electrolyte solution through a filling port (not shown), which is sealed by an electrolyte solution filling plug after the completion of filling the case BC with the electrolyte solution.

Other Embodiments

Listed below are other embodiments of the present invention.

(1) The embodiment described above exemplifies the laser welding device as a welding device for applying a welding focused beam. However, the welding device is not limited to such a laser welding device. A welding device of any type is applicable to the present invention as long as it is capable of setting a small welding spot diameter. For example, it is possible to use an electron beam welding device that employs an electron beam as the welding focused beam.

(2) The embodiment described above exemplifies the case of applying the method of manufacturing the device case according to the present invention to the step of manufacturing an electrical storage device. However, the present invention is not limited to such a case. For example, the present invention is also applicable to the step of manufacturing a device of any type for forming a device case by welding.

(3) The embodiment described above exemplifies the case of applying the focused laser beam LB substantially along the normal line of the lid plate 2. However, the angle of the focused laser beam LB to be applied is not limited to such a case. For example, the angle of the focused laser beam LB to be applied can be changed appropriately as long as the focused laser beam LB is applied to the upper surface of the lid plate 2 (the outer surface of the case BC).

(4) The embodiment described above exemplifies the case where the welded portion MP projects from the outer surface of the case BC (the wall plate 1a of the case body 1). However, the present invention is not limited to such a case. Alternatively, in the welded portion MP shown in FIG. 4B, the portion projecting from the outer surface of the wall plate 1a can be removed by grinding or the like. Still alternatively, the welded portion MP can be prevented from projecting from the outer surface of the wall plate 1a by pressing the end of the lid plate 2 with use of a pressing plate located in parallel with the wall plate 1a during melting the end of the lid plate 2 after the state shown in FIG. 4A. In this manner, the welded portion MP can be formed within the range of the thickness of the wall plate 1a and the lower end of the welded portion MP can reach the wall plate 1a.

The device case and method of manufacturing the device case according to the present invention can be realized in accordance with any one of the following first to twenty first aspects.

In the method of manufacturing the device case according to the first aspect of the present invention, the method includes: bringing a second plate member as part of the device case into contact with an end of a first plate member as another part of the device case; and applying a welding focused beam to weld and fix the first plate member and the second plate member such that a welded portion is formed at a contact portion between the first plate member and the second plate member, wherein the second plate member has a tip end projecting by a set length from an outer surface of the device case, which is on the first plate member and is in contact with the second plate member, the focused beam is applied to the second plate member on an outer surface of the second plate member opposite to a surface in contact with the first plate member, and the welded portion formed by the focused beam includes the entire tip end of the second plate member projecting from the outer surface of the device case on the first plate member and does not reach an inner surface of the device case on the first plate member.

More specifically, when the second plate member is positioned at the end of the first plate member, instead of locating the tip end of the second plate member so as to be flush with the outer surface of the device case on the first plate member, the tip end of the second plate member is located so as to project from the outer surface of the device case on the first plate member.

In this state, the welding focused beam is applied to the second plate member to perform welding work (the so-called penetration welding).

As described above, the tip end of the second plate member is positioned so as to project from the outer surface of the device case on the first plate member. It is thus possible to set the position irradiated with the focused beam so as to be closer to the outer surface of the device case in the thickness direction of the first plate member.

The focused beam entirely melts the tip end of the second plate member projecting from the outer surface of the device case on the first plate member, and the welded portion extends to the contact portion between the first plate member and the second plate member.

In this case, the welded portion can be set so as not to reach the inner surface of the device case on the first plate member because the position irradiated with the focused beam is located closer to the outer surface of the first plate member.

It is because energy of the focused beam is spent for melting the portion of the tip end of the second plate member projecting from the outer surface of the device case on the first plate member. In other words, the welded portion at the end of the first plate member is prevented from extending toward the inner surface of the device case, so that the welded portion does not reach the inner surface of the device case.

In the method of manufacturing the device case according to the second aspect of the present invention, in addition to the configuration according to the first aspect, the welded portion bulges from the outer surface of the device case on the first plate member in a direction substantially normal to the outer surface. The welded portion thus shaped exerts the following effect. After solidification of the welded portion, the joint portion between the first plate member and the second plate member is reinforced by the bulging portion.

In the method of manufacturing the device case according to the third aspect of the present invention, in addition to the configuration according to the first or second aspect, when viewed along the normal line of the outer surface of the second plate member, the center in the area applied with the focused beam in the outer surface of the second plate member is displaced by a distance p from the outer surface of the device case toward the inner side of the device case, and the distance p satisfies $0 \text{ mm} \leq p \leq 0.4 \text{ mm}$.

By setting the area irradiated with the focused beam in this manner, it is possible to effectively melt the tip end of the second plate member.

In the method of manufacturing the device case according to the fourth aspect of the present invention, in addition to the configuration according to one of the first to third aspects, when the set length is denoted by x, the set length x satisfies $0 < x \leq 0.25 \text{ mm}$.

More specifically, when the tip end of the second plate member projects too much from the outer surface of the device case on the first plate member, energy of the welding focused beam is excessively spent for melting the projecting portion. This leads to relatively small energy spent for joining the first plate member and the second plate member.

In order to balance prevention of extension of the welded portion toward the inside of the device case with the joining strength between the first plate member and the second plate member, the length of the projecting portion is set to be not more than 0.25 mm.

In the method of manufacturing the device case according to the fifth aspect of the present invention, in addition to the configuration according to one of the first to fourth aspects, the second plate member has a thickness y satisfying $0.4 \text{ mm} < y \leq 0.8 \text{ mm}$ at the contact portion.

If the second plate member is too thin, the volume of the melt portion on the second plate member is reduced. This leads to large variation in joining strength due to variation in volume of the melted portion and thus results in unstable welding.

On the other hand, if the second plate member is too thick, it is necessary to increase the strength of the focused beam. This increases spattering during welding and results in an unstable shape of the melt portion.

In order to balance between these phenomena and realize stable welding, the thickness y of the second plate member is set to satisfy $0.4 \text{ mm} \leq y \leq 0.8 \text{ mm}$.

In the method of manufacturing the device case according to the sixth aspect of the present invention, in addition to the configuration according to one of the first to fifth aspects, the first plate member corresponds to a wall plate of the device case and the second plate member corresponds to a lid plate covering an end of the wall plate.

When the device case is configured such that the end of the wall plate is covered with the lid plate, it is possible to weld along the edge of the lid plate by applying the focused beam in one direction (along the normal line of the lid plate, for example). This realizes simplification of the configuration of the welding device and reduction in time for welding work.

An electrical storage device according to the seventh aspect of the present invention has the device case formed in accordance with the method of manufacturing the device case according to any one of the first to sixth aspects. It is thus possible to prevent molten matter from spattering into the device case. Such spattering is prevented for the following reason. Upon welding the device case in the step of manufacturing the electrical storage device, an electrical storage element is accommodated in the device case. During the welding work, molten matter made of metal may possibly spatter into the device case. Such spattered molten matter possibly enters the electrical storage element to cause troubles by short circuit and the like.

As described above, it is thus particularly important to prevent the molten matter from spattering into the device case.

A device case according to the eighth aspect of the present invention includes: a case body having a side wall and an opening; a lid plate for closing the opening, an end portion of the lid plate being projected from an outer surface of the side wall; and a welded portion that joins the lid plate with the side wall, wherein the lid plate has a beam receiving area located in a vicinity of an end portion of the lid plate for receiving a beam emitted vertically with respect to the beam receiving area.

In the device case according to the ninth aspect of the present invention, in addition to the configuration according to the eighth aspect, the welded portion extends inside the side wall and ends at the outer surface of the side wall.

In the device case according to the tenth aspect of the present invention, in addition to the configuration according to the eighth or ninth aspect, the end of the lid plate extends in a horizontal direction and the outer surface of the side wall extends in a vertical direction such that a gap is defined below the end portion of the lid plate, the gap extending to the outer surface of the side wall.

In the device case according to the eleventh aspect of the present invention, in addition to the configuration according to one of the eighth to tenth aspects, the welded portion does not reach the inner surfaces of the lid plate and the side wall.

In the device case according to the twelfth aspect of the present invention, in addition to the configuration according to one of the eighth to eleventh aspects, the welded portion projects from the outer surface of the side wall.

In the device case according to the thirteenth aspect of the present invention, in addition to the configuration according to one of the eighth to eleventh aspects, the welded portion does not project from the outer surface of the side wall.

In the device case according to the fourteenth aspect of the present invention, in addition to the configuration according to one of the eighth to thirteenth aspects, the welded portion extends to the outer surface of the lid plate.

In a method of manufacturing a device case according to the fifteenth aspect of the present invention, namely, the method of manufacturing the device case having a first plate member and a second plate member, the method includes the steps of; bringing the second plate member into contact with an end of the first plate member; and applying a beam to a contact portion between the first plate member and the second plate member to form a welded portion, wherein an end portion of the second plate member is projected from an outer surface of the first plate member in the contacting step, the beam is applied to an outer surface of the second plate member opposite to a surface in contact with the first plate member in the applying step, and the welded portion extends over the end portion of the second plate member and does not reach an inner surface of the first plate member.

In the method of manufacturing the device case according to the sixteenth aspect of the present invention, in addition to the configuration according to the fifteenth aspect, the welded portion projects from the outer surface of the first plate member.

In the method of manufacturing the device case according to the seventeenth aspect of the present invention, in addition to the configuration according to the fifteenth or sixteenth aspect, the center in the area applied with a beam in the outer surface of the second plate member is displaced by a distance p from the outer surface of the first plate member toward the inner surface of the first plate member, and the distance p satisfies $0 \text{ mm} \leq p \leq 0.4 \text{ mm}$.

In the method of manufacturing the device case according to the eighteenth aspect of the present invention, in addition to the configuration according to one of the fifteenth to seventeenth aspects, the end portion of the second plate member projects from the outer surface of the first plate member by a length x satisfying $0 \text{ mm} < x \leq 0.25 \text{ mm}$.

In the method of manufacturing the device case according to the nineteenth aspect of the present invention, in addition to the configuration according to one of the fifteenth to eighteenth aspects, the second plate member has a thickness y satisfying $0.4 \text{ mm} \leq y \leq 0.8 \text{ mm}$ at the portion in contact with the first plate member.

In the method of manufacturing the device case according to the twentieth aspect of the present invention, in addition to the configuration according to one of the fifteenth to nineteenth aspects, the device case has a side wall and an opening, and the first plate member corresponds to the side wall, and the second plate member corresponds to a lid plate for closing the opening.

In the method of manufacturing the device case according to the twenty first aspect of the present invention, in addition to the configuration according to one of the fifteenth to twentieth aspects, the beam has a spot diameter d satisfying $d \leq 0.6 \text{ mm}$ on the outer surface of the lid plate.

According to the first aspect, the welded portion formed by the welding focused beam does not reach the inner surface of the device case. It is thus possible to prevent as much as possible molten matter from spattering into the device case even with use of the penetration welding technique in the production of the device case.

According to the second aspect, it is possible to appropriately shape the welded portion. It is also possible to reinforce the joint portion between the first plate member and the second plate member. As a result, the device case can be improved in strength.

According to the third aspect, the tip end of the second plate member can be welded efficiently. The welding work can be thus efficiently performed in the production of the device case.

According to the fourth aspect, prevention of extension of the welded portion toward the inside of the device case is balanced with the joining strength between the first plate member and the second plate member. As a result, welding quality can be stabilized in the step of manufacturing the device case.

According to the fifth aspect, it is possible to appropriately set the thickness of the second plate member. This realizes stable welding work while preventing excessive increase in strength of the focused beam in the production of the device case.

The sixth aspect realizes simplification of the configuration of the welding device and reduction in time for welding work. This realizes reduction in production cost for the device case.

The seventh aspect prevents molten matter from spattering into the device case of the electrical storage device. It is thus possible to enhance reliability of the electrical storage device.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A device case, comprising:
   a case body comprising a side wall and an opening;
   a lid pate for dosing the opening, an end portion of the lid plate being projected horizontally from an outer surface of the side wall; and
   a welded portion that joins the lid plate with the side wall,
   a power generating element disposed within the device case,
   wherein the lid plate comprises a beam receiving area located in a vicinity of the end portion of the lid plate configured for receiving a beam emitted vertically with respect to the beam receiving area, wherein the beam receiving area extends on a top surface of the lid plate in a direction that the end portion of the lid plate projects from the outer surface of the side wall, wherein the welded portion extends over the end portion of the lid plate, extends to the top surface of the lid plate, and does not reach an inner surface of the side wall, wherein a thickness of the welded portion in a thickness direction of the lid plate is more than a thickness of the welded portion in a thickness direction of the side wall, and wherein, in the thickness direction of the side wall, the welded portion bulges beyond the outer surface of the side wall, and in the thickness direction of the lid plate, the welded portion reaches the top surface of the lid plate.

2. The device case according to claim 1, wherein the welded portion extends inside the side wall and ends at the outer surface of the side wall.

3. The device case according claim 1, wherein the end portion of the lid plate extends in a horizontal direction and the outer surface of the side wall extends in a vertical direction such that a gap is defined below the end portion of the lid plate, the gap extending to the outer surface of the side wall.

4. The device case according to claim 1, wherein the welded portion does not reach inner surfaces of the lid plate and the side wall.

5. The device case according to claim 1, wherein the welded portion projects from the outer surface of the side wall.

6. The device case according to claim 1, wherein the welded portion does not project from the outer surface of the side wall.

7. The device case according to claim 1, wherein the welded portion extends to an outer surface of the lid plate.

8. A method of manufacturing the device case according to claim 1, the case body including a first plate member and the lid plate including a second plate member, the method comprising:

bringing the second plate member into contact with an end of the first plate member; and applying a beam to a contact portion between the first plate member and the second plate member to form a welded portion, wherein an end portion of the second plate member is horizontally projected from an outer surface of the first plate member in the bridging, wherein the beam is applied to an outer surface of the second pate member opposite to a surface in contact with the first plate member in the applying, wherein the welded portion extends over the end portion of the second plate member and does not reach an inner surface of the first plate member, and wherein the beam is applied vertically to a beam receiving area that extends on a top surface of the second plate member in a direction that the end portion of the second plate member projects from the outer surface of the first plate member.

9. The method of manufacturing the device case according to claim 8, wherein the welded portion projects from the outer surface of the first plate member.

10. The method of manufacturing the device case according to claim 8, wherein a center in the beam receiving area applied with the beam in the outer surface of the second plate member is displaced by a distance p from the outer surface of the first plate member toward the inner surface of the first plate member, and the distance p satisfies 0 mm≤p≤0.4 mm.

11. The method of manufacturing the device case according to claim 8, wherein the end portion of the second plate member projects from the outer surface of the first plate member by a length x satisfying 0 mm<x≤0.25 mm.

12. The method of manufacturing the device case according to claim 8, wherein the second plate member has a thickness y satisfying 0.4 mm≤y≤0.8 mm at the portion in contact with the first plate member.

13. The method of manufacturing the device case according to claim 8, wherein the device case comprises a side wall and an opening, and wherein the first plate member corresponds to the side wall, and the second plate member corresponds to a lid plate for closing the opening.

14. The method of manufacturing the device case according to claim 8, wherein the beam has a spot diameter d satisfying d≤0.6 mm on the outer surface of the second plate member.

15. The device case according to claim 1, wherein the device case comprises a battery case.

16. A battery case, comprising:
a case body comprising a side wall and an opening;
a lid plate for closing the opening; and
a welded portion that joins the lid plate with the side wall,
a power generating element disposed within the battery case, wherein the welded portion projects from an outer surface of the side wall, wherein the welded portion extends over an end of the lid plate, extends to an outer surface of the lid plate, and does not reach an inner surface of the side wall, wherein a thickness of the welded portion in a thickness direction of the lid plate is more than a thickness of the welded portion in a thickness direction of the side wall, and wherein, in the thickness direction of the side wall, the welded portion bulges beyond the outer surface of the side wall, and in the thickness direction of the lid plate, the welded portion reaches a top surface of the lid plate.

17. The battery case according to claim 16, wherein the welded portion does not reach inner surfaces of the lid plate and the side wall.

* * * * *